United States Patent [19]
Summers et al.

[11] 4,282,447
[45] Aug. 4, 1981

[54] SIGNAL BUFFER CIRCUIT ARRANGEMENT

[75] Inventors: Christopher P. Summers, London; Donald G. Thompson, Wallington, both of England

[73] Assignee: U.S. Philips Corporation, New York, N.Y.

[21] Appl. No.: 944,333

[22] Filed: Sep. 21, 1978

[30] Foreign Application Priority Data

Sep. 26, 1977 [GB] United Kingdom ............... 40033/77
May 25, 1978 [GB] United Kingdom ............... 40033/77

[51] Int. Cl.³ .................... H03K 17/66; H03K 17/76; H03K 5/156
[52] U.S. Cl. .................................. 307/255; 307/243; 307/259; 307/262; 307/DIG. 1; 328/118
[58] Field of Search ............... 307/216, 217, 243, 255, 307/259, 262, DIG. 1; 328/97, 117, 118; 315/392

[56] References Cited

U.S. PATENT DOCUMENTS

| 2,728,866 | 12/1955 | Edwards | 307/216 X |
| 2,864,961 | 12/1958 | Lohman et al. | 307/243 |
| 3,032,679 | 5/1962 | Roberts, Jr. et al. | 315/392 |
| 3,077,545 | 2/1963 | Rywak | 307/255 X |
| 3,103,597 | 9/1963 | Novick et al. | 307/259 X |
| 3,146,357 | 8/1964 | Spallone | 307/259 X |
| 3,311,751 | 3/1967 | Maestre | 307/262 X |
| 3,471,714 | 10/1969 | Gugliotti, Jr. et al. | 307/255 X |
| 3,479,531 | 11/1969 | Gauld | 307/255 |
| 3,790,823 | 2/1974 | Briley | 307/243 X |
| 4,010,385 | 3/1977 | Krol | 307/243 |

FOREIGN PATENT DOCUMENTS 848497 9/1960 United Kingdom ............... 328/97

Primary Examiner—Larry N. Anagnos
Attorney, Agent, or Firm—Thomas A. Briody; William J. Streeter; Algy Tamoshunas

[57] ABSTRACT

An interface device for selectively accessing two internal signal paths of an integrated circuit through a single external connection pin. Each of the signal paths is provided with a bias voltage sensitive conduction device that permits conduction at a different externally provided bias voltage that inhibits current flow in the other conduction device. The different bias voltages are provided to the external connection pin through an external load resistor.

2 Claims, 1 Drawing Figure

SIGNAL BUFFER CIRCUIT ARRANGEMENT

This invention relates to signal buffer circuit arrangements and more particularly to a signal buffer circuit arrangement of a type suitable for providing an interface between the circuit of an integrated circuit and an external circuit.

A well-known problem that exists in the design of integrated circuits is to use on an integrated circuit as few pins as possible for making external connections between the internal circuitry of the integrated circuit and external circuitry. The fewer the number of pins that are used, the more cost effective is an integrated circuit package, even where additional circuity is included in the integrated circuit in order to save using a pin.

It may be desirable to provide an integrated circuit that has a particular output that can be interfaced with an input of an external circuit which may require an integrated circuit output of one polarity for one form of the external circuit but of opposite polarity for another form of the external circuit. One example of this is in television receivers some of which are designed to receive a separated synchronizing signal without inversion, whereas others are designed to receive a separated synchronizing signal which has been inverted. Thus, a sync. separator circuit which is realized as an integrated circuit package for general use as a component of a television receiver would normally require two separate external pins to provide the two versions of the separated synchronising signal.

The present invention proposes for an integrated circuit a signal buffer circuit arrangement of the above type which enables only a single external pin to be used to provide at that pin an output signal of one or the other of two possible different polarities or one of the other of two different amplitudes ranges of the same polarity. The two signals involved may be different versions of the same signal or they may be two entirely separate signals.

The invention uses the concept of providing two current paths including respective unidirectional conductive devices and of permitting conduction in one or the other only of these two current paths by appropriate forward-biasing and reverse-biasing of these devices. One simple application of this concept is shunt-limiting using two diodes which are connected with opposite polarity in parallel-connected conduction paths. Another application of this concept, given in U.S. Pat. No. 3,032,679, is passive electronic switching using two parallel-connected signal paths including respective diodes which are connected with opposite polarity and are forward-biased alternately by square wave generator pulses to permit two differing signals, which are adapted respectively to the two signal paths, to be fed alternately to an oscilloscope.

According to the invention there is provided a signal buffer circuit arrangement of the type referred to having two current paths including respective unidirectional conductive devices by which conduction in one or the other only of these two current paths can be controlled, which arrangement is characterized in that it comprises internally of the integrated circuit two signal paths which form said two current paths and which are connected to the same external connecting pin of the integrated circuit, in each of which signal paths the respective unidirectional conductive device can be arranged to be reverse-biased in the presence of a signal in the other path to inhibit the passage of a signal in its own path, said signals being of opposite polarity or occupying respective different amplitude ranges of the same polarity, and said arrangement further comprising externally of the integrated circuit a load resistor which is connected at one end to said external connecting pin, together with means for connecting the other end of said load resistor to one or the other of two bias voltage terminals to which can be applied respective biasing voltages for determining which one of the two unidirectional conductive devices is to be reverse-biased, as aforesaid.

In one particular embodiment of the invention the unidirectional conductive device in one signal path is a first transistor of one conductivity type and the unidirectional conductive device in the other signal path is a second transistor of the opposite conductivity type, which first and second transistors have their emitter-collector paths connected in series between supply lines, with their emitters connected together and to said external connecting pin, and the arrangement further comprising an input transistor having its base connected to receive an input signal, and its emitter and collector connected one each to the base of a respective one of said first and second transistors to feed thereto non-inverted and inverted versions of the input signal, one of said first and second transistors being biased for conduction and the other being cut-off, as determined by the connection of said load resistor. This embodiment gives the advantage that a single signal source can be used to provide an input signal which is transformed into non-inverted and inverted versions by the arrangement.

In order that the invention may be more fully understood, reference will now be made by way of example to the drawing accompanying the Provisional Specification. In the drawing.

Figure 1:
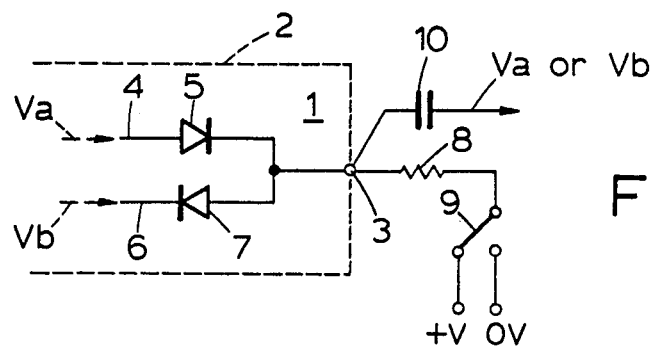
FIG. 1 is a simplified diagram of a signal buffer circuit arrangement according to the invention.

Referring to the drawing, the signal buffer circuit arrangement shown in FIG. 1 is assumed to be provided for inter-facing with external circuitry an integrated circuit 1 which is represented by the broken line 2 and in respect of which only that portion thereof which forms part of the signal buffer circuit arrangement, and a single external connecting pin 3, are shown. The signal buffer circuit arrangement comprises a first signal path 4 having a diode 5 connected to the pin 3 with one polarity, and a second signal path 6 having a diode 7 connected to the pin 3 with opposite polarity. Externally of the integrated circuit 1, the pin 3 is connected via a load resistor 8 to either OV or +V bias voltage terminals as determined by the position of a switch 9.

Figure 2:
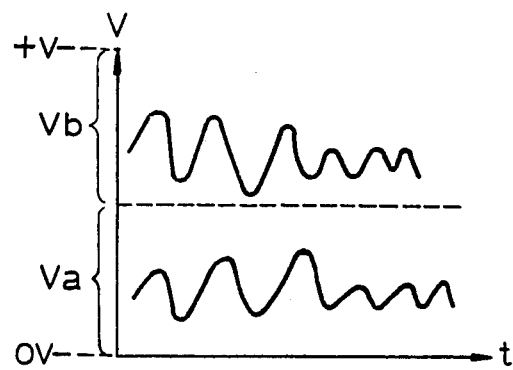
FIG. 2 shows waveform diagrams which are illustrative of the operation of the signal buffer circuit arrangement of FIG. 1.

It is assumed that the integrated circuit 1 is to provide at the pin 3 either a signal voltage Va or a signal voltage Vb. When the load resistor 8 is connected to the OV terminal, the diode 5 is forward biased and the diode 7 is reverse biased. As a result, the signal voltage Va appears at the pin 3. On the other hand, when the load resistor 8 is connected to the +V terminal, the diode 5 is reverse biased and th diode 7 is forward biased, so that now the signal voltage Vb appears at the pin 3. The amplitude relationship between the signal voltages Va and Vb is shown in FIG. 2, from which it can be seen that the signal voltage Vb must always be of greater amplitude than the signal voltage Va and the amplitudes of both signal voltages must lie between the bias voltages OV and +V. This simple arrangement using two diodes which are connected with opposite polarity in the two signal paths has the advantage that passive electronic switching is used for the signal path selection.

The two signal voltages Va and Vb can be entirely unrelated, or one can be the inverse of the other. However, in a particular application of the invention which is contemplated, the integrated circuit 1 would be a sync. separator circuit which provides the signal voltages Va and Vb as non-inverted and inverted separated synchronising signals. This gives the advantage of providing either sync. signal at the same external connecting pin. The signal voltage selected by the switching of the load resistor 8 is taken from the pin 3 for utilization via a coupling capacitor 10.

Figure 3:
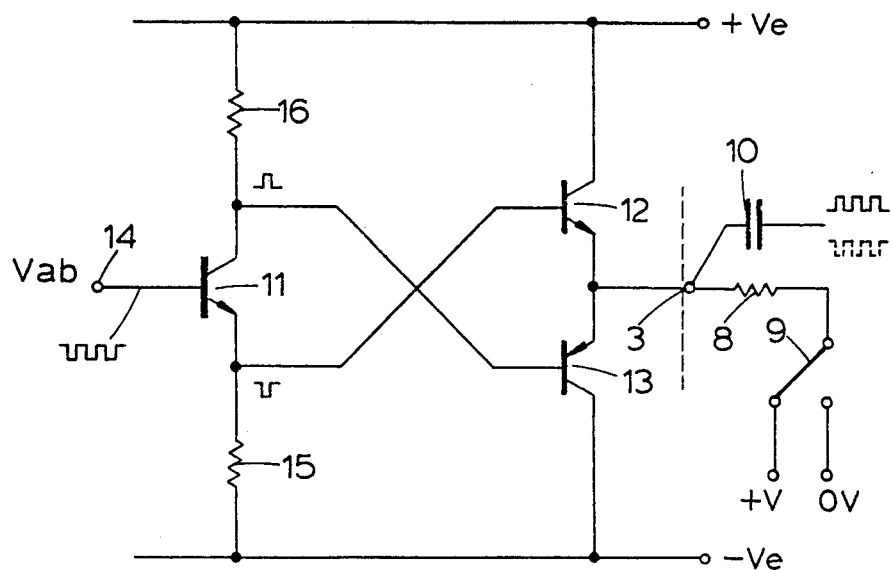
FIG. 3 shows a more detailed realisation of a signal buffer circuit arrangement according to the invention.

The more detailed signal buffer circuit arrangement shown in FIG. 3 comprises three transistors 11, 12, and 13 and is connected between a signal voltage terminal 14 to which a signal voltage Vab is applied, and the integrated circuit external connecting pin 3. The load resistor 8, switch 9 and bias voltage terminals +V and OV are as already shown in FIG. 1. The transistor 11 is an input transistor which has its emitter-collector path connected between positive and negative supply lines +ve and −ve in series with equal value emitter and collector resistors 15 and 16. The signal voltage Vab is applied to the base of transistor 11 which is responsive to produce a same polarity version of the signal voltage Vab at its emitter and an inverted polarity version of the signal voltage Vab at its collector. The two transistors 12 and 13 are of opposite conductivity types and have their emitter-collector paths connected in series between the positive and negative supply lines +ve and −ve. The emitters of these two transistors 12 and 13 are connected together and to the external connecting pin 3.

Assuming that the voltages on the positive and negative supply lines +ve and −ve have, respectively, the same value as the bias voltages at terminals +V and OV, say, +12 v and ground, respectively, then when the load resistor 8 is switched to the bias voltage terminal OV, transistor 12 is biased for conduction and transistor 13 is cut-off. Conversely, when the load resistor 8 is strapped to the bias voltage terminal +V, transistor 13 is biased for conduction and transistor 12 is cut-off. The bases of the two transistors 12 and 13 are connected to the emitter and collector, respectively, of the transistor 11. The particular transistor 12 or 13 which is biased for conduction switching the load resistor 8 is responsive to the same or inverted polarity version (as the case may be) of the signal voltage Vab applied to its base to produce that version of the signal voltage Vab at its emitter and thus at the external connecting pin 3.

We claim:

1. A signal buffer circuit arrangement for providing an interface between an output terminal of an integrated circuit and an external circuit, said integrated circuit being provided internally with at least two current paths, one of said current paths including a first transistor of one conductivity type and the other current path including a second transistor of the opposite conductivity type, said first and second transistors having their emitter-collector paths connected in series between supply lines and their emitters connected to said output terminal so that each of said first and second transistors is rendered separately conductive at different bias voltage levels that inhibit the conductivity of the other of said first and second transistors, said arrangement further comprising an input transistor having its base connected to receive an input signal, and its emitter and collector connected one each to the base of a respective one of said first and second transistors to feed thereto noninverted and inverted versions of said input signal, a load resistor external of said intergrated circuit connected to said output terminal, and means external of said integrated circuit for connecting said load resistor selectively to one of at least two bias voltage sources providing said different bias voltage levels such that one of said first and second conductors is biased for conduction and the other is cut-off.

2. The circuit arrangement according to claim 1 wherein said integrated circuit is a synchronizing pulse separator circuit and said input signal at the base of said input transistor is a synchronizing signal provided by said integrated circuit so that noninverted or inverted synchronizing signals appear at said output terminal.

* * * * *